United States Patent
Pekny

(10) Patent No.: US 8,136,000 B2
(45) Date of Patent: Mar. 13, 2012

(54) TEST MODE FOR MULTI-CHIP INTEGRATED CIRCUIT PACKAGES

(75) Inventor: Theodore T. Pekny, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 12/885,781

(22) Filed: Sep. 20, 2010

(65) Prior Publication Data

US 2011/0007539 A1    Jan. 13, 2011

Related U.S. Application Data

(62) Division of application No. 11/472,618, filed on Jun. 22, 2006, now Pat. No. 7,802,157.

(51) Int. Cl.
*G11C 29/00* (2006.01)

(52) U.S. Cl. ........................................ 714/718; 714/724

(58) Field of Classification Search ........................ None
See application file for complete search history.

(56) References Cited

U.S. PATENT DOCUMENTS

| | | | |
|---|---|---|---|
| 4,782,486 A | 11/1988 | Lipcon et al. | |
| 5,293,386 A | 3/1994 | Muhmenthaler et al. | |
| 5,615,162 A * | 3/1997 | Houston | 365/226 |
| 5,675,545 A * | 10/1997 | Madhavan et al. | 365/201 |
| 5,946,257 A * | 8/1999 | Keeth | 365/226 |
| 6,301,182 B1 * | 10/2001 | Tanaka | 365/221 |
| 6,493,839 B1 | 12/2002 | Miner | |
| 6,603,219 B2 * | 8/2003 | Toyama et al. | 307/38 |
| 6,686,759 B1 | 2/2004 | Swamy | |
| 6,992,576 B2 | 1/2006 | Washizu | |
| 7,057,866 B2 * | 6/2006 | Hsu et al. | 361/18 |
| 7,171,596 B2 * | 1/2007 | Boehler | 714/718 |
| 7,308,624 B2 * | 12/2007 | Versen et al. | 714/718 |
| 7,437,632 B2 * | 10/2008 | Marr | 714/723 |
| 7,498,839 B1 * | 3/2009 | Jenkins, IV | 326/41 |
| 7,609,561 B2 * | 10/2009 | Cornwell et al. | 365/185.33 |
| 7,707,472 B1 * | 4/2010 | Dastidar | 714/733 |
| 2005/0289428 A1 | 12/2005 | Ong | |

* cited by examiner

*Primary Examiner* — Jeffrey A Gaffin
*Assistant Examiner* — Steve Nguyen
(74) *Attorney, Agent, or Firm* — Leffert Jay & Polglaze, P.A.

(57) ABSTRACT

When a test mode of a controller of a multi-chip integrated circuit package is activated, external signal lines coupled to the controller are re-mapped to signal lines of one of the integrated circuit devices of the multi-chip integrated circuit package to permit direct testing of the integrated circuit device.

20 Claims, 3 Drawing Sheets

US 8,136,000 B2

TEST MODE FOR MULTI-CHIP INTEGRATED CIRCUIT PACKAGES

RELATED APPLICATION

This is a divisional application of application Ser. No. 11/472,618, titled "TEST MODE FOR MULTI-CHIP INTEGRATED CIRCUIT PACKAGES," filed Jun. 22, 2006 now U.S. Pat. No. 7,802,157 (allowed), which application is assigned to the assignee of the present invention and the entire contents of which are incorporated herein by reference.

TECHNICAL FIELD OF THE INVENTION

The present invention relates generally to integrated circuit devices and in particular the present invention relates to a test mode for multi-chip integrated circuit packages.

BACKGROUND OF THE INVENTION

Multi-chip (or multi-die) memory packages contain a number of individual memory devices, e.g., that may be stacked one above another. Each memory device may be a NAND or a NOR flash memory device, dynamic random access memory (DRAM) device, static random access memory (SRAM) device, or the like. A multi-chip memory package typically includes a memory controller for accessing and controlling each memory device. The memory controller usually includes external inputs and outputs for coupling to a host device, such as a processor, a memory controller in a personal computer, a processor of tester hardware, etc. Problems arise during testing after the multi-chip memory package is assembled, such as during back-end testing as part of the manufacturing process or during testing of a defective multi-chip memory package, e.g., returned by a user. Such problems occur because internal functioning of the memory devices cannot be accessed directly through the external inputs and outputs of the multi-chip memory package.

For the reasons stated above, and for other reasons stated below which will become apparent to those skilled in the art upon reading and understanding the present specification, there is a need in the art for alternative test methods for multi-chip memory packages.

DETAILED DESCRIPTION

Figure 1:
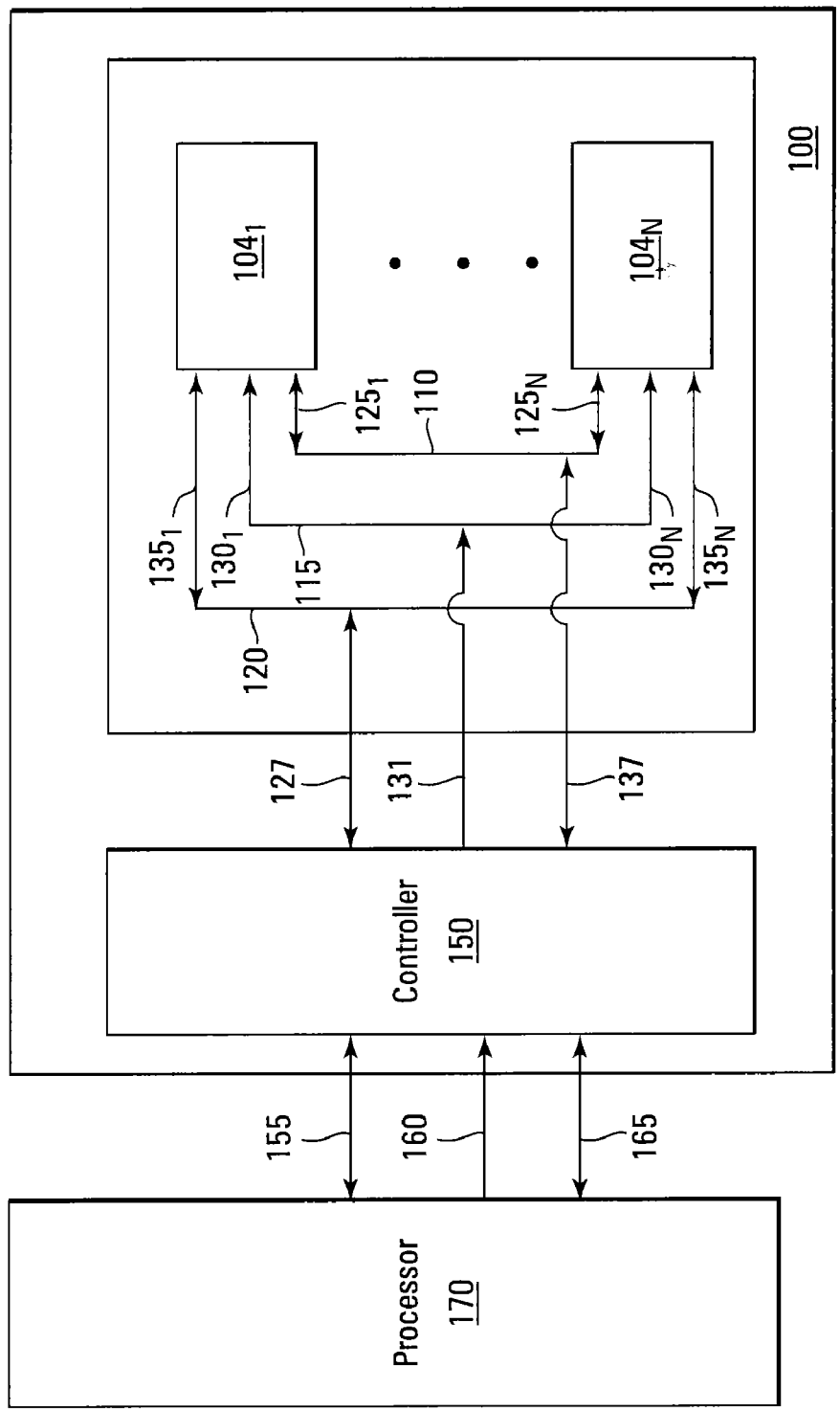
FIG. 1 is a block diagram illustrating a multi-chip integrated circuit package, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 is a block diagram illustrating a multi-chip (or multi-die) integrated circuit package, such as a multi-chip memory device 100, according to an embodiment of the invention. The multi-chip integrated circuit package includes a plurality of integrated circuit devices, such as memory chips (or memory devices) 104. Examples of memory devices include NAND or NOR flash memory devices, dynamic random access memory devices (DRAMs), static random access memory devices (SRAMs), or the like.

For one embodiment, a common control signal bus 110 is coupled to a control signal line 125 of each of memory devices 104; a common address bus 115 is coupled to an address signal line 130 of each of memory devices 104; and a common data bus 120 is coupled to a data signal line 135 of each of memory devices 104. For another embodiment, multi-chip memory device 100 includes a memory controller 150 that is separate from memory devices 104. Memory controller 150 provides data signals, address signals, and control signals to each of memory devices 104 via data bus 120, address bus 115, and control signal bus 110 through data (DQ) lines 127, address lines 131, and control lines 137, respectively. For another embodiment, the address signals, data signals, and control signals are respectively provided to each of memory devices 104 on a single shared signal line (or bus) by switching the respective signals onto the shared bus. For yet another embodiment, address signals and data signals are provided to each of memory devices 104 on a shared signal line (or bus), and the control signals are provided on a separate signal line.

FIG. 1 further shows that multi-chip memory device 100 may be coupled to a processor 170 to form part of an electronic system. For one embodiment, multi-chip memory device 100 may be an active component of the electronic system or a device under test in the electronic system, where processor 170 forms a portion of a tester. Examples of electronic systems include such systems as computer systems, peripheral devices, cellular and wireless devices, digital cameras, audio recorders, personal digital assistants (PDAs) and test equipment.

Processor 170 provides data signals, address signals, and control signals to memory controller 150 through external data signal line 155, external address signal line 160, and external control signal line 165, respectively. For another embodiment, the address signals, data signals, and control signals are respectively provided to memory controller 150 on a single shared bus by switching the respective signals onto the shared bus. For yet another embodiment, address signals and data signals are provided to memory controller 150 on a shared bus, and the control signals are provided on a separate line.

Memory controller 150 includes a test mode that is activated and deactivated in response to receiving test-mode-activation and test-mode-deactivation signals from processor 170. When the test mode is activated, memory controller 150 maps at least a portion of the external signal lines of multi-chip memory device 100, e.g., external data line 155, external address line 160, and external control line 165, respectively to at least a portion of the signal lines of a selected memory device 104, e.g., data line 125, address line 130, and control line 135, in accordance with embodiments of the invention. Moreover, when the test mode is activated, controller 150 prevents, or at least restricts, communication between processor 170 and the remaining memory devices 104 via the external signal lines, e.g., by respectively preventing or restricting all communication between processor 170 and the remaining memory devices 104 or preventing outputs from the remaining memory devices 104 from reaching processor 170. For one embodiment, the outputs from the remaining memory devices 104 may be prevented from reaching processor 170 by placing all of the signal lines of each remaining memory device in a high impedance (high Z) state.

Specifically, for one embodiment, at least the test-mode-activation signal for activating the test mode includes an indicator that instructs controller 150 to map external signal lines of multi-chip memory device 100 to a particular memory device 104 when the test mode is activated. Further, in response to receiving the indicator, controller 150 prevents, or at least restricts, communication between the remaining memory devices 104 and processor 170. For another embodiment, in response to receiving the test-mode-deactivation signal, controller 150 exits the test mode, and the relationship between the external signal lines of multi-chip memory device 100 and the signal lines of the selected memory device 104 is restored to that which occurs during normal operation of controller 150, and normal communication between controller 150 and processor 170 and between controller 150 and memory devices 104 is also restored.

Figure 2:
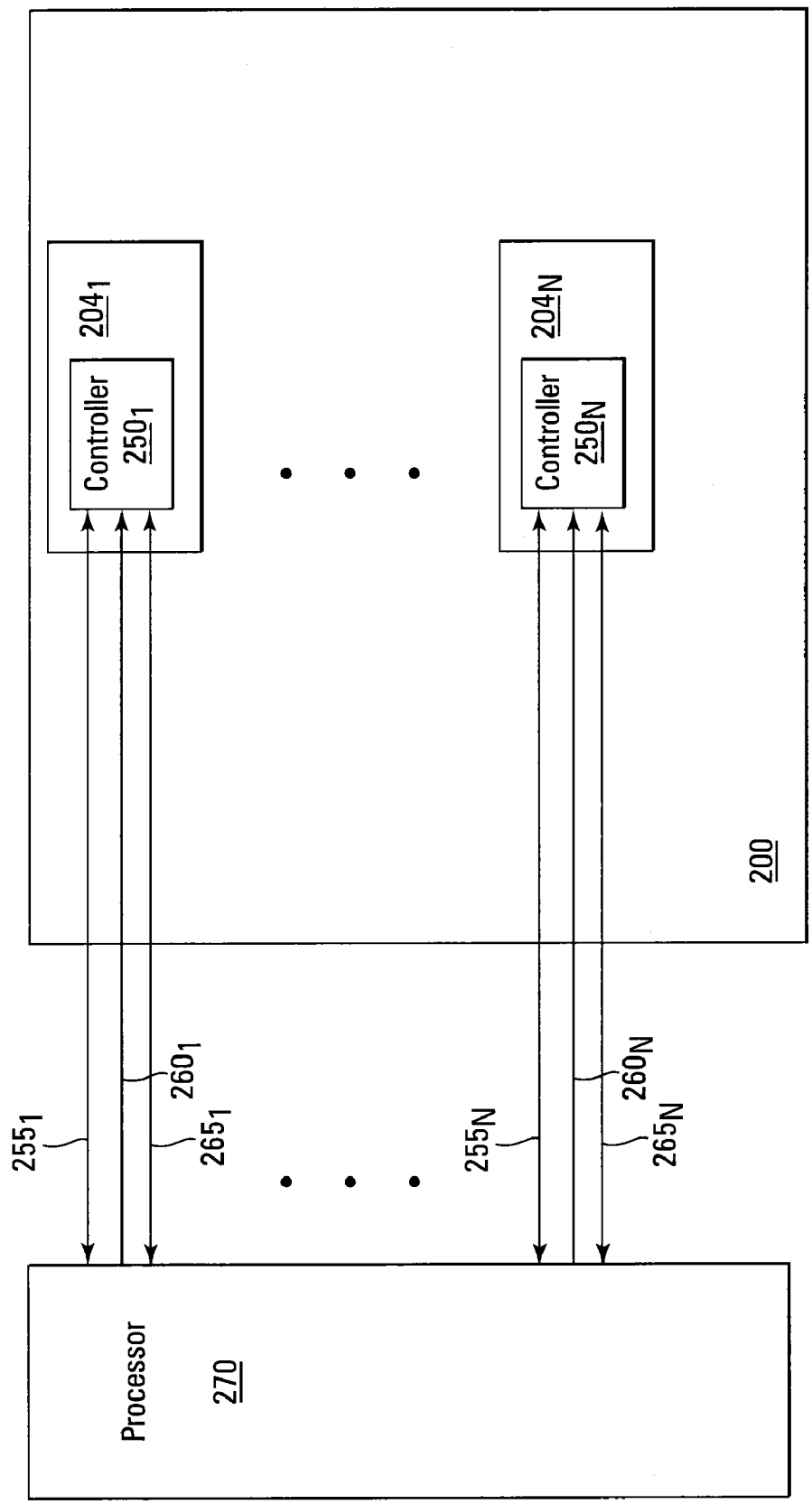
FIG. 2 is a block diagram illustrating a multi-chip integrated circuit package, according to another embodiment of the invention.

FIG. 2 is a block diagram illustrating a multi-chip (or multi-die) integrated circuit package, such as a multi-chip memory device 200, according to another embodiment of the invention. The multi-chip integrated circuit package includes a plurality of integrated circuit devices, such as memory chips (or memory devices) 204. Each of the memory devices 204 has an integrated memory controller 250. Each memory controller 250 provides data signals, address signals, and control signals to its respective memory device 204. For one embodiment, each controller 250 provides the address signals, data signals, and control signals to its respective memory device 204 on a single shared bus by switching the respective signals onto the shared bus. For yet another embodiment, each controller 250 provides address signals and data signals to its respective memory device 204 on a shared bus, and the control signals are provided on a separate line.

Multi-chip memory device 200 may be coupled to a processor 270 to form part of an electronic system. For one embodiment, multi-chip memory device 200 may be an active component of the electronic system or a device under test in the electronic system, where processor 270 forms a portion of a tester. Processor 270 provides data signals, address signals, and control signals to each memory controller 250 through external data lines 255, external address signal lines 260, and external control signal lines 265, respectively. For another embodiment, the address signals, data signals, and control signals are respectively provided to each memory controller 250 on a single shared bus by switching the respective signals onto the shared bus. For yet another embodiment, address signals and data signals are provided to each memory controller 250 on a shared bus, and the control signals are provided on a separate line.

Each memory controller 250 includes a test mode that is activated and deactivated in response to signals received from processor 270. When the test mode is activated, the memory controller 250 whose test mode is activated maps at least a portion of the external signal lines coupled to that memory controller 250, e.g., external data line 255, external address line 260, and external control line 265 respectively to signal lines of the memory device 204 having that memory controller 250 integrated thereon in accordance with embodiments of the invention. For one embodiment, processor 270 activates the test mode of a single controller 250 by sending the signal for activating the test mode of that controller 250 to that controller 250. Substantially concurrently, for another embodiment, processor 270 sends a signal to each of the remaining controllers 250 that instructs these controllers 250 to prevent, or at least restrict, communication between their respective memory devices 204 and processor 270 via the external signal lines e.g., by respectively preventing or restricting all communication between processor 270 and the remaining memory devices 204 or preventing outputs from the remaining memory devices 204 from reaching processor 270.

For another embodiment, processor 270 may send a single signal to each of controllers 250 for either activating a test mode of the controller or restricting or preventing communication between the corresponding memory device and the processor. For example, a test mode may be activated for a memory device 204 if that memory device 204, e.g., memory device $204_1$, receives the signal, and communication may be restricted or prevented between the remaining memory devices, e.g., memory devices $204_2$ to $204_N$, and the processor if those memory devices receive the signal. For one embodiment, the signal may include an address of the memory device to be tested. The test mode is activated for the memory device whose address matches the address included in the signal, whereas communication is restricted or prevented between the remaining memory devices having addresses that do not match the address included in the signal.

For another embodiment, each memory controller 250 may include two test modes that are activated and deactivated in response to signals received from processor 270. When a first test mode is activated, the controller 250 maps at least a portion of the external signal lines respectively to signal lines of the memory device 204 having that memory controller 250 integrated thereon. When a second test mode is activated, the controller 250 restricts or prevents communication between the memory device with that controller 250 and processor 270. Note that for some embodiments, a single signal may be received at each of the controllers from processor 270. The first test mode is activated for the memory device whose address matches the address included in the signal, whereas the second test mode is activated for those memory devices having addresses that do not match the address included in the signal. For another embodiment, to deactivate the first and second test modes, a single signal may be sent to each of the controllers from processor 270. Receiving the signal at the controller whose first test mode is activated deactivates the first test mode and restores normal operation of that controller. Receiving the signal at the controllers whose second test modes are activated deactivates the second test modes and restores normal operation of those controllers.

For another embodiment, processor 270 sends a signal to the controller 250 whose test mode is activated instructing that controller 250 to exit the test mode, and substantially concurrently, processor 270 sends signals to the remaining controllers 250 instructing them to restore normal communication between their respective memory devices and processor 270. In addition, exiting the test mode restores the relationship between the external signal lines coupled to memory controller 250 that was activated and the signal lines of the memory device 204 corresponding to that controller 250 to that which occurs during normal operation of controller 250. For another embodiment, a single signal may be sent to each of the controllers from processor 270. When the signal is received by the controller whose test mode is activated that controller exits the test mode, and when the signal is received at the controllers of each of the remaining memory devices, normal communication between these memory devices and processor 270 is restored.

For some embodiments, one or more multi-chip memory packages 100 and/or one or more multi-chip memory packages 200 are included in a memory module, such as a memory card. Examples of memory modules include Compact-Flash™ memory cards licensed by SanDisk Corporation, Memory Stick™ memory cards licensed by Sony Corporation, SD Secure Digital™ memory cards licensed by Toshiba Corporation, OneNAND licensed by Samsung Electronics Corporation, a USB flash drive, and the like. For one embodiment, multi-chip memory device 100 may include external connections, such as pins, for interfacing with processor 170 for passing control, address and/or data signals between multi-chip memory device 100 and processor 170, with processor 170 having compatible receptors for the external pins. Similarly, multi-chip memory device 200 may include external connections, such as pins, for interfacing with processor 270 for passing control, address and/or data signals between multi-chip memory device 200 and processor 270, with processor 270 having compatible receptors for the external pins.

Figure 3:
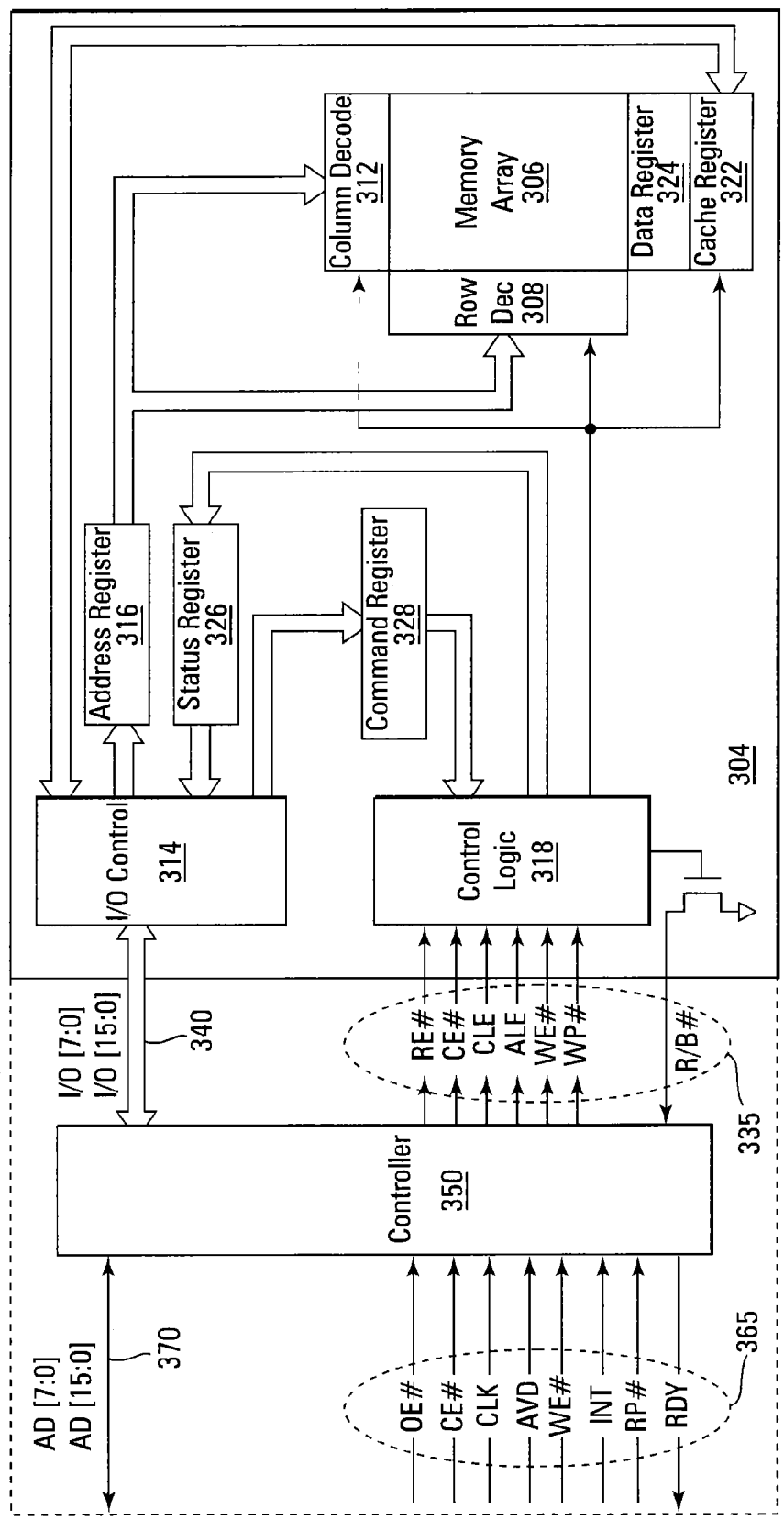
FIG. 3 is a simplified block diagram of a NAND flash memory device coupled to a memory controller, according to another embodiment of the invention.

FIG. 3 is a simplified block diagram of a NAND flash memory device 304 coupled to a memory controller 350, such as described above for controller 150 of FIG. 1 or each of controllers 250 of FIG. 2, as part of a multi-chip memory device, such as multi-chip memory device 100 of FIG. 1 or multi-chip memory device 200 of FIG. 2, according to another embodiment of the invention. Memory device 304 includes an array of memory cells 306 arranged in rows and columns. A row decoder 308 and a column decoder 312 are provided to decode address signals. Address signals are received and decoded to access memory array 306. Memory device 304 also includes input/output (I/O) to manage input of commands, addresses and data to the memory device 304 as well as output of data and status information from the memory device 304. An address register 316 is coupled between I/O control circuitry 314 and row decoder 308 and column decoder 312 to latch the address signals prior to decoding. A command register 328 is coupled between I/O control circuitry 314 and control logic 318 to latch incoming commands. Control logic 318 controls access to the memory array 306 in response to the commands and generates status information for memory controller 350 and subsequently for a processor, such as processor 170 of FIG. 1 or processor 270 of FIG. 2. The control logic 318 is coupled to row decoder 308 and column decoder 312 to control the row decoder 308 and column decoder 312 in response to the addresses. Control logic 318 is also coupled to a cache register 322.

Cache register 322 latches data, either incoming or outgoing, as directed by control logic 318 to temporarily store data while the memory array 306 is busy writing or reading, respectively, other data. During a write operation, data is passed from the cache register 322 to data register 324 for transfer to the memory array 306; then new data is latched in the cache register 322 from the I/O control circuitry 314. During a read operation, data is passed from the cache register 322 to the I/O control circuitry 314 for output to memory controller 350 and thus to the processor; then new data is passed from the data register 324 to the cache register 322. A status register 326 is coupled between I/O control circuitry 314 and control logic 318 to latch the status information for output to memory controller 350 and thus to the processor.

For one embodiment, memory controller 350 is separate from memory device 304, and memory device 304 is one of a plurality of memory devices 304 coupled to memory controller 350 that is coupled to a processor, such as processor 170, as described above in conjunction with FIG. 1. For this embodiment, memory device 304 may correspond to a memory device selected for testing. For another embodiment, memory controller 350 may be an integral part of memory device 304, as indicated by the dashed line of FIG. 3. For this embodiment, memory device 304, including memory controller 350, is one of a plurality of memory devices, where the memory controllers are coupled to a processor, such as processor 270, as described above in conjunction with FIG. 2. For this embodiment, memory device 304, including memory controller 350, may correspond to a memory device selected for testing. Note that, the functionality of controller 350 may be performed by control logic 318 and I/O control 314.

Memory device 304 receives control signals at control logic 318 from memory controller 350 over a control signal line 335 that for one embodiment is analogous to control signal line 135 of FIG. 1. The control signals may include a read enable RE#, a chip enable CE#, a command latch enable CLE, an address latch enable ALE, a write enable WE#, and a write protect WP#. A ready/busy status signal R/B# is output over control signal line 335 to indicate when memory device 304 is processing a PROGRAM or an ERASE operation or during a READ operation to indicate when data is being transferred from memory array 306.

Memory device 304 receives command signals (or commands), address signals (or addresses), and data signals (or data) from memory controller 350 at an input/output (I/O) port over a multiplexed I/O signal line 340 and outputs data to memory controller 350 through the I/O port over I/O signal line 340. For one embodiment, I/O signal line 340 is analogous to data signal line 125 and an address signal line 130 of FIG. 1 in combination.

Specifically, the commands are received over input/output (I/O) pins I/O [7:0] corresponding to I/O signal line 340 at I/O control circuitry 314 and are written into command register 328. The addresses are received over input/output (I/O) pins I/O [7:0] corresponding to signal line 340 at I/O control circuitry 314 and are written into address register 316. The data are received over input/output (I/O) pins I/O [7:0] for an 8-bit device or input/output (I/O) pins I/O [0:15] I/O [15:0] for a 16-bit device at I/O control circuitry 314 and are written into cache register 322. The data are subsequently written into data register 324 for programming memory array 306. Data are also output over input/output (I/O) pins I/O I/O [7:0] for an 8-bit device or input/output (I/O) pins I/O [15:0] for a 16-bit device. It will be appreciated by those skilled in the art that additional circuitry and control signals can be provided, and that the memory device of FIG. 3 has been simplified to help focus on the invention. Additionally, while specific I/O pins are described in accordance with popular conventions for receipt and output of the various signals, it is noted that other combinations or numbers of I/O pins may be used in the various embodiments.

Memory controller 350 receives external control signals from a processor, such as processor 170 of FIG. 1 or processor 270 of FIG. 2, over an external control signal line 365 that for one embodiment is analogous to external control signal line 165 of FIG. 1 or an external control signal line 265 of FIG. 2. The control signals may include an output enable OE#, a chip enable CE#, a clock CLK, an address valid detect AVD, a write enable WE#, an interrupt INT, and a reset RP#. A ready control signal RDY is output over control signal line 365 to the processor. Memory controller 350 receives command signals (or commands), address signals (or addresses), and data signals (or data) from the processor at an input/output (I/O) port over a multiplexed external I/O signal line 370 and outputs data to the processor through the I/O port over I/O signal line 370. For one embodiment, I/O signal line 370 is analogous to external data signal line 155 and external address signal line 160 of FIG. 1 in combination or an external data signal line 255 and an external address signal line 260 of FIG. 2 in combination.

Specifically, the commands are received over input/output (I/O) pins AD [7:0] corresponding to I/O signal line 370. The data are received over input/output (I/O) pins AD [7:0] for an 8-bit device or input/output (I/O) pins AD [5:0] for a 16-bit device. Data are also output over input/output (I/O) pins AD [7:0] for an 8-bit device or input/output (I/O) pins AD [15:0] for a 16-bit device. It will be appreciated by those skilled in the art that while specific I/O pins are described in accordance with popular conventions for receipt and output of the various signals, it is noted that other combinations or numbers of I/O pins may be used in the various embodiments.

Memory controller 350 includes at least one test mode that when activated maps external signal lines coupled to controller 350 to the signal lines of memory device 304. For one embodiment, when the test mode is activated, lines of external control signal line 365 are respectively mapped to portions (or lines) of control signal line 335, and external input/output (I/O) pins AD [7:0] or AD [15:0] of the memory package corresponding to external I/O signal line 370 are respectively mapped to (I/O) pins I/O [7:0] or I/O [15:0] corresponding to I/O signal line 340. Specifically, for one embodiment, when the test mode is activated, external signal lines of the memory package respectively corresponding to input control signals output enable OE#, chip enable CE#, clock CLK, address valid detect AVD, write enable WE#, interrupt INT, and reset RP# and output ready control signal RDY are respectively mapped to portions (or lines) of control signal line 335 respectively corresponding to input control signals read enable RE#, chip enable CE#, command latch enable CLE, address latch enable ALE, write enable WE#, and write protect WP# and output ready/busy control signal R/B#. For embodiments as described above in conjunction with FIG. 2, controller may include two test modes, where the just described test mode corresponds to one of the test modes, and the other test mode restricts or prevents communication between memory device 304 and the processor.

For one embodiment, the above-mentioned test mode of controller 350 is activated in response to the test-mode-activation signal received from the processor, such as processor 170 of FIG. 1 or processor 270 of FIG. 2, where the test-mode-activation signal is indicative of a desire to enter a test mode and an identity of the one of the integrated circuit devices. For another embodiment, the test-mode-activation command may be a sequence of commands, and controller 350 enters the test mode in response to a correct sequence of commands and performs the above-described mapping. For some embodiments, the command sequence may include low-voltage command signals having voltages that are on the order of the normal operating voltages of memory device 304, high-voltage command signals having voltages that are above the normal operating voltages of memory device 304, or a sequence of high- and low-voltage commands. For one embodiment, the test-mode-activation command is received at controller 350 at the external signal line corresponding to the reset RP#.

For one embodiment, the processor places memory device 304 into an internal test mode by sending a pattern, sequence, or potential level of one or more of the control signals (hereinafter called a test-mode enable signal) to memory device 304, e.g., to control logic 318 of memory device 304. For one embodiment, control logic 318 is adapted to enable the internal test mode and to control testing functions internal to memory device 304 during the internal test mode in response to the test-mode enable signal.

For other embodiments, the test mode of controller 350 is exited in response to controller 350 receiving the test-mode-deactivation signal from the processor. For one embodiment, the test-mode-deactivation signal may be sequence of commands, such as a sequence of low-voltage commands, high-voltage commands, or both.

CONCLUSION

Embodiments of the invention provide multi-chip integrated circuit packages, such as multi-chip memory packages. For one embodiment, a multi-chip integrated circuit package has a controller having a test mode. When the test mode is activated, the controller maps external signal lines coupled thereto to signal lines of one of the chips of the multi-chip integrated circuit package. For another embodiment, when the test mode is activated, the controller at least restricts communication between the external signal lines and remaining chips of the multi-chip integrated circuit package. For another embodiment, a multi-chip memory package may have a single controller separate from the chips of the multi-chip integrated circuit package or a controller integrated on each of the chips of the multi-chip integrated circuit package.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of testing a memory chip of a multi-chip memory package, comprising:
   receiving a first external signal at a controller integrated on the memory chip to select the memory chip for testing;
   activating a test mode of the controller in response to receiving the first external signal;
   mapping external signal lines coupled to the controller to signal lines of the memory chip selected for testing in response to activating the test mode of the controller;
   receiving a second external signal at controllers integrated on each of the remaining memory chips of the multi-chip memory package;
   at least restricting communication between external signal lines coupled to the controllers integrated on each of remaining memory chips and each of the remaining memory chips in response to receiving the second external signal at the controllers integrated on each of the remaining memory chips;
   deactivating the test mode of the controller integrated on the memory chip selected for testing; and
   restoring communication between the external signal lines coupled to the controllers integrated on each of the remaining memory chips and each of the remaining memory chips to that which occurs during normal operation of the controllers integrated on each of the remaining memory chips;
   wherein each controller is configured to provide address and/or data signals to its respective memory chip during normal operation of that controller.

2. The method of claim 1, wherein deactivating the test mode of the controller integrated on the memory chip selected for testing is in response to receiving a third external signal at the controller integrated on the memory chip selected for testing, and wherein deactivating the test mode of the controller integrated on the memory chip selected for testing restores a relationship between the external signal lines and the signal lines of the memory chip selected for testing to that which occurs during normal operation of the multi-chip memory package.

3. The method of claim 2, wherein restoring communication between the external signal lines coupled to the controllers integrated on each of remaining memory chips and each of remaining memory chips to that which occurs during normal operation of the controllers integrated on each of remaining memory chips is in response to receiving a fourth external signal at the controllers integrated on each of the remaining memory chips.

4. The method of claim 1, wherein operation of the controller during the test mode after the mapping differs from that which occurs during normal operation of that controller.

5. The method of claim 1, wherein at least one external signal line used during the test mode is also used to convey the address and/or data signals to the controller during normal operation of that controller.

6. The method of claim 1, wherein at least restricting communication comprises preventing communication.

7. A method of testing a multi-chip memory package, comprising:
receiving a first external signal at controllers integrated on each of a plurality of memory chips of the multi-chip memory package;
activating a first test mode of a controller of a memory chip in response to receiving the first external signal at that controller;
mapping external signal lines coupled to the controller, whose first test mode is activated, to signal lines of the memory chip with that controller in response to activating the first test mode;
activating a second test mode of the controllers integrated on each of the remaining memory chips in response to receiving the first external signal at those controllers;
at least restricting communication between external signal lines coupled to the controllers integrated on each of remaining memory chips and each of the remaining memory chips in response to activating the second test mode of the controllers integrated on each of the remaining memory chips;
receiving a second external signal at each of the controllers;
deactivating the first test mode at the controller whose first test mode is activated in response to receiving the second external signal at that controller;
deactivating the second test mode at each of the controllers integrated on each of the remaining memory chips in response to receiving the second external signal at those controllers; and
restoring communication between the external signal lines coupled to the controllers integrated on each of the remaining memory chips and each of the remaining memory chips to that which occurs during normal operation of the controllers integrated on each of the remaining memory chips in response to deactivating the second test mode;
wherein each controller is configured to provide address and/or data signals to its respective memory chip during normal operation of that controller.

8. The method of claim 7, wherein the memory chip with the controller whose first test mode is activated has an address that matches an address included in the first external signal.

9. The method of claim 8, wherein the memory chips with the controllers whose second test modes are activated have addresses that do not match the address included in the first external signal.

10. A multi-chip integrated circuit package, comprising:
a plurality of integrated circuit devices; and
a controller integrated on each of the integrated circuit devices;
wherein each controller has first and second test modes;
wherein when the first test mode of a controller is activated that controller maps external signal lines coupled thereto to one or more signal lines of the integrated circuit device on which that controller is integrated;
wherein when the second test mode of a controller is activated that controller at least restricts communication between the external signal lines and one or more signal lines of the integrated circuit device on which that controller is integrated;
wherein, in response to disabling the second test mode of a controller, that controller restores the communication, that was at least restricted during the second test mode, between the external signal lines and the one or more signal lines of the integrated circuit device on which that controller is integrated to that which occurs during normal operation of that controller; and
wherein each controller is configured to provide address and/or data signals to its respective integrated circuit device during normal operation of that controller.

11. The multi-chip integrated circuit package of claim 10, wherein the first and second test modes are activated in response to receiving at least one external signal at that controller.

12. The multi-chip integrated circuit package of claim 11, wherein the first test mode of an integrated circuit device is activated in response to that integrated circuit device receiving an external signal comprising an address that matches an address of that integrated circuit device.

13. The multi-chip integrated circuit package of claim 10, wherein when the first test mode is activated for one of the memory chips, the second test mode is activated for the remaining memory chips.

14. The multi-chip integrated circuit package of claim 11, wherein the second test mode of an integrated circuit device is activated in response to that integrated circuit device receiving an external signal comprising an address that does not match that integrated circuit device.

15. The multi-chip integrated circuit package of claim 11, wherein the first test mode of an integrated circuit device is activated in response to the integrated circuit device receiving a first external signal and the second test mode of the integrated circuit device is activated in response to the integrated circuit device receiving a second external signal.

16. The multi-chip integrated circuit package of claim 11, wherein when the second test mode of a controller is activated that controller prevents communication between the external signal lines and one or more signal lines of the integrated circuit device on which that controller is integrated.

17. The multi-chip integrated circuit package of claim 11, wherein at least one external signal line used during the first test mode of a controller is also used to convey the address and/or data signals to that controller during normal operation of that controller.

18. A memory module, comprising:
one or more multi-chip memory packages, wherein at least one of the one or more multi-chip memory packages comprises:
a plurality of memory devices; and
a controller integrated on each of the memory devices;
wherein each controller has first and second test modes;
wherein when the first test mode of a controller is activated that controller maps external signal lines coupled thereto to one or more signal lines of the integrated circuit device on which that controller is integrated;
wherein when the second test mode of a controller is activated that controller at least restricts communication between the external signal lines and one or more signal lines of the integrated circuit device on which that controller is integrated;
wherein, in response to disabling the second test mode of a controller, that controller restores the communication, that was at least restricted during the second test mode, between the external signal lines and the one or more signal lines of the integrated circuit device on which that controller is integrated to that which occurs during normal operation of that controller; and
wherein each controller is configured to provide address and/or data signals to its respective memory chip during normal operation of that controller.

19. An electronic system, comprising:
a processor; and
at least one multi-chip memory package, the at least one multi-chip memory package, comprising:
a plurality of memory devices; and
a controller integrated on each of the memory devices and coupled to the processor by first signal lines;
wherein each controller has first and second test modes;
wherein when the first test mode of a controller is activated that controller maps at least a portion of the first signal lines to at least a portion of second signal lines of the integrated circuit device on which that controller is integrated;
wherein when the second test mode of a controller is activated that controller at least restricts communication between at least a portion of the first signal lines and at least a portion of second signal lines of the integrated circuit device on which that controller is integrated;
wherein, in response to disabling the second test mode of a controller, that controller restores the communication, that was at least restricted during the second test mode, between at least a portion of the first signal lines and at least a portion of second signal lines of the integrated circuit device on which that controller is integrated to that which occurs during normal operation of that controller; and
wherein each controller is configured to provide address and/or data signals to its respective memory chip during normal operation of that controller.

20. The electronic system of claim 19, wherein the test modes are activated in response to receiving at least one signal at each controller from the processor.

* * * * *